United States Patent
Krause et al.

(10) Patent No.: US 8,197,912 B2
(45) Date of Patent: Jun. 12, 2012

(54) PRECISION SEPARATION OF PV THIN FILM STACKS

(75) Inventors: Rainer Krause, Kostheim (DE); Gerd Pfeiffer, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 583 days.

(21) Appl. No.: 12/403,076

(22) Filed: Mar. 12, 2009

(65) Prior Publication Data

US 2010/0233386 A1    Sep. 16, 2010

(51) Int. Cl.
| | |
|---|---|
| C23C 16/52 | (2006.01) |
| C23C 14/54 | (2006.01) |
| C23C 14/30 | (2006.01) |
| B05D 5/12 | (2006.01) |
| B05D 3/00 | (2006.01) |
| C08J 7/18 | (2006.01) |
| H02N 6/00 | (2006.01) |
| H01L 31/042 | (2006.01) |
| B23P 15/00 | (2006.01) |
| C03C 25/00 | (2006.01) |

(52) U.S. Cl. .................. 427/555; 427/8; 427/9; 427/10; 427/74; 427/596; 216/39; 136/244; 136/252

(58) Field of Classification Search .................. 136/244, 136/246, 252; 216/23, 24, 25, 39; 427/8, 427/9, 10, 74, 75, 551, 552, 555, 596
See application file for complete search history.

(56) References Cited

U.S. PATENT DOCUMENTS

| | | | |
|---|---|---|---|
| 4,712,063 A * | 12/1987 | Osterwald et al. | 324/761.01 |
| 6,300,593 B1 * | 10/2001 | Powell | 219/121.68 |
| 6,455,347 B1 | 9/2002 | Hiraishi et al. | |
| 6,632,993 B2 | 10/2003 | Hayashi et al. | |
| 7,259,321 B2 * | 8/2007 | Oswald et al. | 136/244 |
| 2008/0105295 A1 * | 5/2008 | Manz | 136/252 |
| 2008/0196761 A1 | 8/2008 | Nakano et al. | |

FOREIGN PATENT DOCUMENTS

EP      482240 A1 *    4/1992

* cited by examiner

*Primary Examiner* — Michael Cleveland
*Assistant Examiner* — Michael Wieczorek
(74) *Attorney, Agent, or Firm* — Kunzler Needham Massey & Thorpe

(57) ABSTRACT

A method for manufacturing thin film panels comprises providing a laser patterning system, depositing a base layer on a glass substrate, separating the base layer by scribing a plurality of separation lines corresponding with a predefined scribe pattern, depositing a functional layer on the base layer, determining a first base layer separation edge, moving the translation stage by a first distance, activating the laser array and moving the translation stage by a second distance, deactivating the laser array, determining subsequent separation edges of the base layer and scribing lines therein, depositing a top layer on the functional layer, determining a first functional layer separation edge, operating the stepper motor to move the translation stage by a third distance, activating the laser array and moving the translation stage by a fourth distance, deactivating the laser array, and determining subsequent separation edges of the functional layer and scribing lines therein.

7 Claims, 15 Drawing Sheets

PRECISION SEPARATION OF PV THIN FILM STACKS

FIELD OF THE INVENTION

The present invention generally relates to a system and method for manufacturing thin film panels. The present invention more specifically relates to a system and method using contrast recognition in order to achieve automated and precise alignment of a scribe pattern on a panel to overcome overlay matching problems.

BACKGROUND OF THE INVENTION

Several industrial applications require the separation of large area structures into smaller sub-structures. One common example is the structuring of thin film solar panels formed on glass substrates. With regard to the formation of thin film solar panels, surface patterning is used to define individual areas or cells, while at the same time monolithically integrating the individual cells of a panel to provide a specific output voltage. A key requirement of surface patterning is to minimize the scribe area in order to maximize the active area and efficiency of a module. Typically, the efficiency of a module is reduced by 5-10% due to the inactive scribe area. As appreciated by those skilled in the art, the inactive scribe area may be minimized by optimizing the width of the individual scribe lines (i.e., making the lines as narrow as possible) while avoiding shorts and other contact problems.

Generally speaking, the serialization or parallelization of solar modules is realized in the prior art through a laser cutting process that is manually performed. One disadvantage of this process results from the manual positioning of the cutting edge and the width. Particularly, during the manufacturing process, surface patterning has to be applied several times (after each individual material deposition step) which can lead to overlay matching issues. Therefore, what is needed is an improved system and method that is capable of precise alignment of scribe patterns in order to overcome overlay matching problems during the manufacture of thin film panels.

BRIEF SUMMARY OF THE INVENTION

The present invention solves the foregoing problems by providing a method for manufacturing thin film panels with a laser patterning system comprising: (a) providing a laser patterning system having a motorized translation stage, a computerized control system, an optical system including a single beam laser and a laser array, and a stepper motor operably coupled to the computerized control system and structured to cause movement of the translation stage; (b) depositing a base layer on top of a glass substrate; (c) separating the base layer by scribing a plurality of separation lines with the single beam laser, the plurality of separation lines corresponding with a predefined scribe pattern; (d) depositing a functional layer on top of the base layer; (e) determining a first base layer separation edge of the base layer using a refraction system that includes an infrared light source having a beam that is focused on a top surface of the functional layer; (f) operating the stepper motor to move the translation stage forward by a first distance; (g) activating the laser array and operating the stepper motor to move the translation stage forward by a second distance; (h) deactivating the laser array; (i) determining a subsequent base layer separation edge using the refraction system; (j) repeating steps (f)-(i) until the translation stage detects an end of the base layer; (k) when the translation stage detects the end of the base layer, depositing a top layer on top of the functional layer; (l) determining a first functional layer separation edge using the refraction system, wherein the beam of the infrared light source is focused on a top surface of the top layer; (m) operating the stepper motor to move the translation stage forward by a third distance upon detection of the first functional layer separation edge; (n) activating the laser array and operating the stepper motor to move the translation stage forward by a fourth distance; (o) deactivating the laser array; (p) determining a subsequent functional layer separation edge using the refraction system; and (q) repeating steps (m)-(p) until the translation stage detects an end of the functional layer. As will be appreciated by those skilled in the art, the present invention may improve throughput, quality and cost of the final product in a substantial manner.

DETAILED DESCRIPTION OF THE INVENTION

Figure 1A:
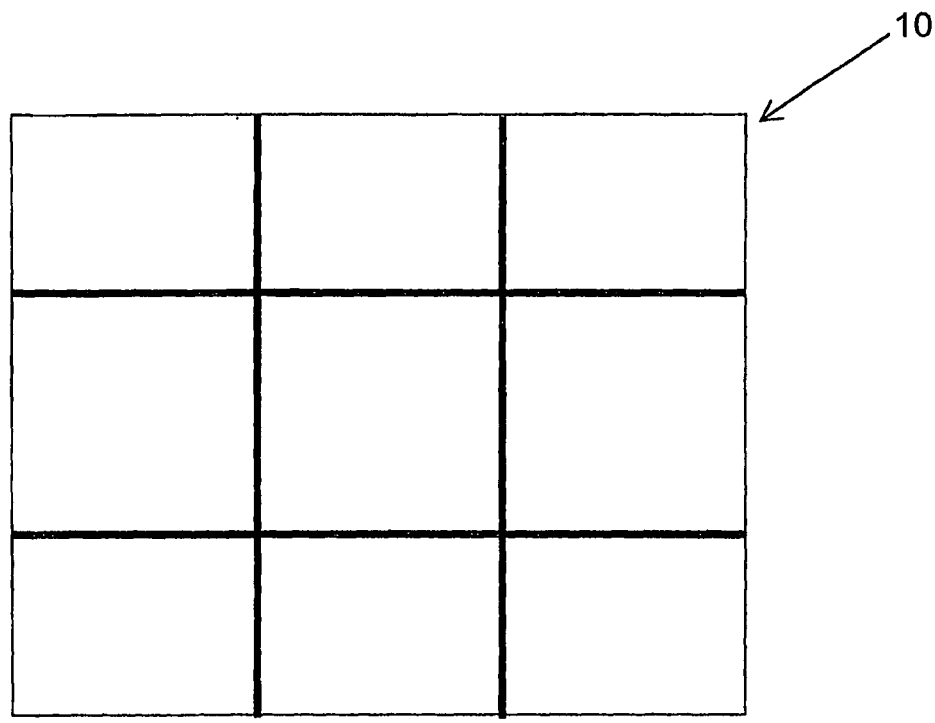
FIG. 1A is a diagram illustrating one exemplary multilayer panel after the precision patterning steps of the present invention.
Figure 1B:
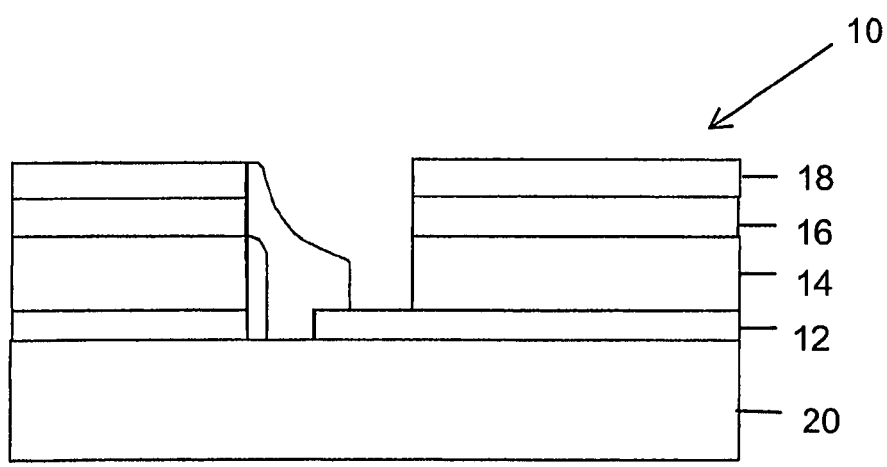
FIG. 1B is a side view illustrating a portion of the multilayer panel of FIG. 1A.
Figure 2:
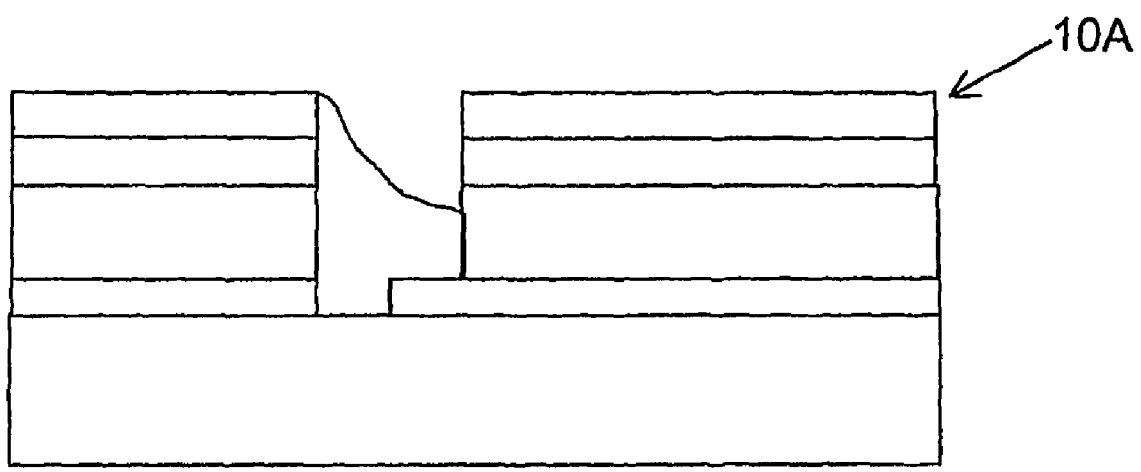
FIG. 2 is a diagram illustrating an exemplary multilayer panel formed using a manual patterning process.

Generally speaking, the system and method of the present invention enable automated line cutting and formation of electrical contacts on deposited multi layer structures. The inventive concept may be applied to separate deposited multilayers into well defined segments as illustrated in FIGS. 1A-1B. In particular, FIG. 1A, is a diagram illustrating one exemplary multilayer panel 10 after the precision patterning steps of the present invention, while FIG. 1B is a side view illustrating a portion of the multilayer panel 10 of FIG. 1A. As illustrated in FIG. 1B, the multilayer panel 10 includes a base layer 12, a first functional layer 14, a second functional layer 16, and a top layer 18. The base layer 12 is positioned on top of a substrate 20. For purposes of comparison, FIG. 2 illustrates an exemplary multilayer panel 10A formed using a manual patterning process where the scribe lines are not perfectly aligned and result in quality issues including electrical shorts in the panel.

In accordance with the system and method of the present invention, after deposition of a base layer onto a glass substrate, a desired line basic pattern may be transferred into the base layer via mechanical or laser scribing. As successive layers are deposited on top of the base layer, the scribe pattern will become covered. The present invention allows for the automatic detection of the buried pattern so that the scribe system may be aligned precisely to the previous pattern for scribing in subsequent layers. This approach minimizes or prevents line overlay matching problems, which commonly occur in the prior art systems and methods used today involving manual alignment with a microscope and stepper motor. Again, FIG. 2 is an exemplary diagram illustrating such overlay matching problems. As will be appreciated by those skilled in the art, not only does automated handling prevent matching overlay problems, but it also may drastically reduce the amount of process time compared to manual handling.

The line scribing may be performed in any suitable manner, such as by using either a single laser beam or optically split laser beams. The line scribing may also be performed using a linear laser diode array. A description for such a set up is provided below.

For purposes of example and not limitation, the precision separation process of the present invention will be described in reference to the case of a multilayer structure of the type typically used in photovoltaic (PV) thin film technology. One exemplary embodiment is a CIGS (Copper, Indium, Gallium, Selenide) photovoltaic multilayer structure. However, as will be appreciated by those skilled in the art, numerous other multilayer structures may be used in conjunction with and benefit from the present invention.

Typically, the layer stack for CIGS consists of a molybdenum (Mo) layer deposited on top of a glass substrate and the CIGS layer on top of the Mo layer. In one exemplary embodiment, the Mo layer may have a thickness of about 1 micron, while the CIGS layer may have a thickness in a range between about 1 and 5 microns. The CIGS layer may be followed by a very thin buffer layer, and a top layer that may serve as a second electrical contact. Exemplary buffer layer materials may include CdS and ZnS, while an exemplary top layer material may include ZnO.

The first patterning step may occur after deposition of the Mo layer, where a predefined scribe pattern may be transferred to the Mo layer. In one embodiment, this may be accomplished with a laser beam at a power level sufficient to ablate the Mo film. As will be appreciated by those skilled in the art, Mo is opaque to light in the visible or near IR wavelength range.

The second patterning step may occur after deposition of the CIGS layer (and optionally a buffer layer), which is transparent to wavelengths above approximately 1 μm. The first component of this second patterning step for patterning the CIGS layer is to detect the location of the pattern previously scribed into the Mo layer and to use this position to define the next scribe pattern for the CIGS layer. For example, the next scribe pattern may be a direct overlay, or alternatively may include an offset in order to define the pattern required for electrical contacting. Since the CIGS layer may be melted by the incident laser beam, the pattern recognition step may require either low laser power for the refraction measurement method or backside illumination for the image contrast method as will be discussed in detail below. For the actual patterning, the CIGS material may be ablated by the incident laser beam and removed by vacuum suction. During the patterning process, some of the melted CIGS material may also flow onto the side of the groove created by the beam.

Once the CIGS layer has been properly scribed, the top layer may be deposited over the CIGS layer. The third patterning step begins with detection of the scribe pattern created at the previous scribing step. To detect the scribe pattern at these levels, any suitable imaging method may be used. However, in one exemplary embodiment, a refraction method using a low power IR light source may be employed as will be described in detail below. Once the scribe pattern has been detected, the scribing step itself may be performed with a laser having a wavelength that is selected such that the energy is absorbed completely in the topmost layer and the material is ablated.

The actual scribing portion of the first patterning step of the Mo layer may be performed with any suitable scribing means, such as with a laser beam as previously discussed. One exemplary laser beam suitable for scribing the Mo layer may be an individual Nd YAG laser beam.

The subsequent layers (CIGS, buffer layer, top layer, etc.) deposited on the Mo layer may thereafter be patterned using any suitable laser system. In one exemplary embodiment, the laser system includes a linear array of diode lasers, although numerous other laser systems are contemplated and within the intended scope of the present invention. Because these additional layers such as the CIGS layer are all transparent, they may be separated using lower laser energies. In one exemplary embodiment, the device for separating these subsequent layers may be a laser array capable of separation in one "shot."

One exemplary laser patterning system in accordance with the present invention may include a motorized X-Y translation stage and a computerized control system. The motorized X-Y translation stage may be structured to hold the optical system used to detect line patterns and perform the actual scribing (either mechanical or laser scribing). The translation stage may be moved to a desired position by a suitable motor, such as a stepper motor, which may be operably coupled to and controlled by the computerized system. The computerized control system may include a processor to process instructions, a memory to store various data, and input means for inputting data.

With further regard to the patterning of the CIGS panel discussed above, the first patterning step may define a line grid and line width, which may be transferred into appropriate X-Y coordinates for use by the X-Y translation stage. For each patterning step after the Mo layer, the laser patterning system may use the coordinate grid defined initially for the Mo layer to drive the X-Y translation stage to the proximity of the line to be scribed. The laser patterning system may then be used to detect the edge of the scribe line in the previous layer to precisely align the scribe pattern of the current layer with the pattern scribed into the previous layer.

In order to achieve high throughput for the laser patterning system, a scheme such as the following may be used: Beginning with the Mo layer, the translation stage may be moved from a "park" position so that it approaches the first target line in a "fast" mode at a first rate of speed. At a predetermined distance ahead of the calculated first target line, the speed may be reduced to a "slow" mode having a second rate of speed. Although any suitable first and second rate of speed may be used, in one exemplary embodiment, the first rate of speed may be about 20 mm/sec and the second rate of speed may be about 1 mm/sec. Furthermore, in one exemplary embodiment the predetermined distance ahead of the target line may be about 10 mm. However, other distances are also contemplated. By utilizing these varying rates of speed, the edge of the first target line may detected by the laser patterning system with improved accuracy. Once the edge of the first line is detected, the next step is to scribe the line, such as with a single laser beam or an array. Once the line is scribed, the translation stage may be moved and any additional lines detected and scribed until the patterning of the panel is complete. As will be appreciated by those skilled in the art, the pattern detection process for the second and all subsequent lines may be more efficient since the translation stage may be moved in a fast mode at the first rate of speed to within a closer distance of the next target line position, reducing the distance traveled in the slow mode at the second rate of speed. In one exemplary embodiment, the translation stage may move at the faster first rate of speed until it is about 2 mm ahead of the calculated second target line (and any subsequent target lines on the layer). The above process may continue until the laser patterning step is complete in both the X and Y directions.

Figure 3:
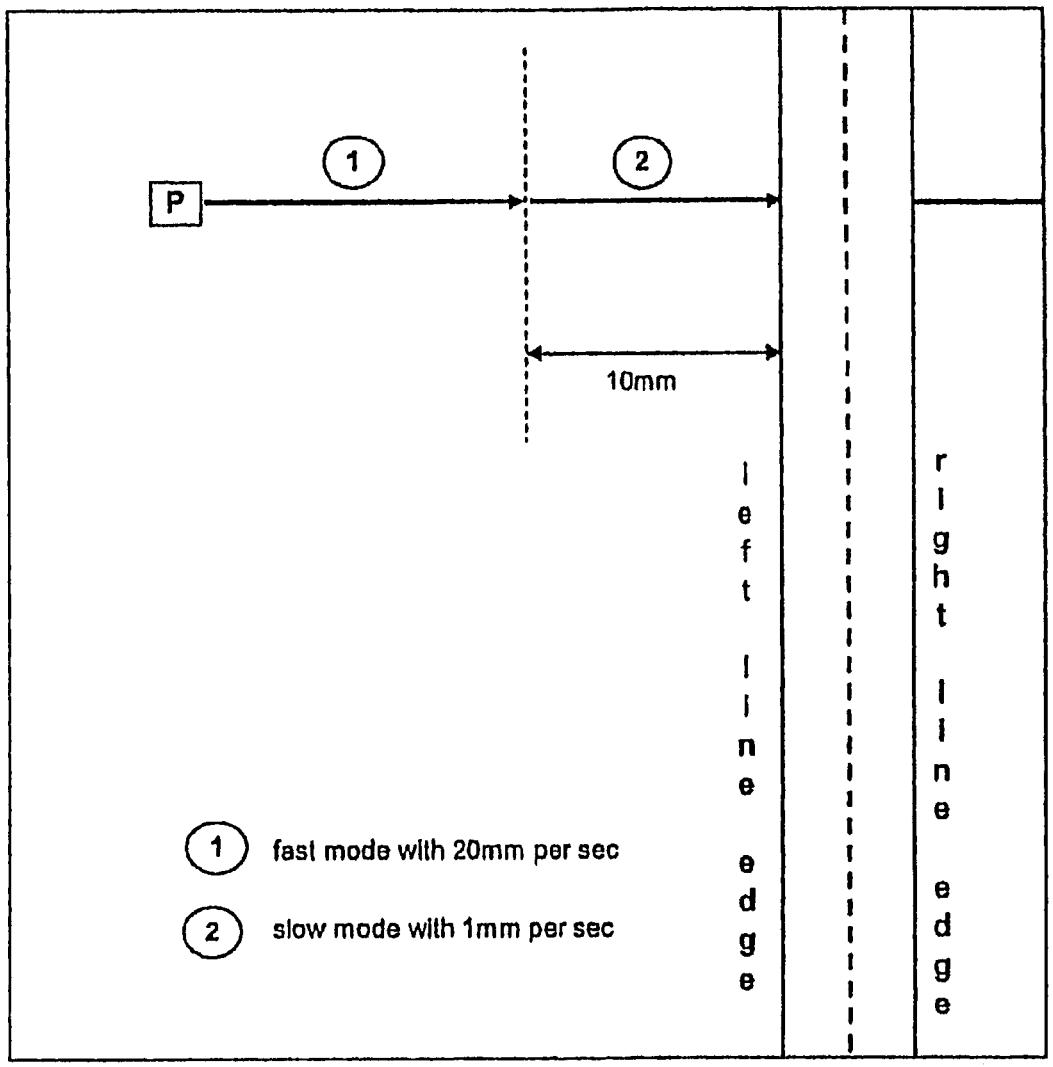
FIG. 3 is a diagram illustrating a first step of a line detection process in accordance with the present invention.
Figure 4:
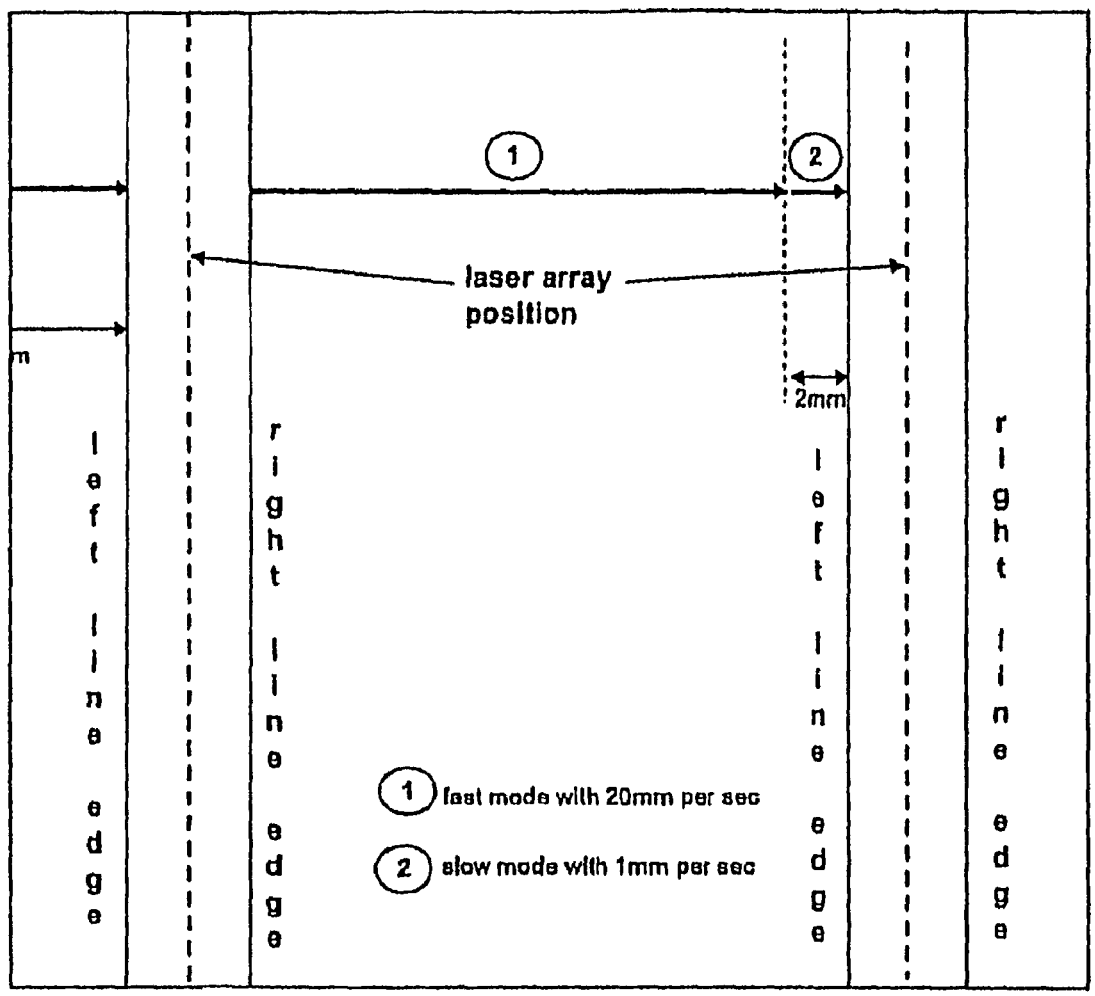
FIG. 4 is a diagram illustrating a second step of the line detection process of FIG. 3.

One exemplary embodiment of the line detection process previously described is illustrated in FIGS. 3 and 4. In particular, FIG. 3 illustrates the initial step of moving the translation stage from the "park" position to the first target line at the first rate of speed until a distance of about 10 mm ahead of the target line, and then at the second rate of speed until the edge of the first target line is detected. FIG. 4 illustrates the subsequent movement of the translation stage to find a second target line wherein the translation stage is moved at the first rate of speed until a distance of about 2 mm ahead of the target line, and then at the second rate of speed until the edge of the second target line is detected. Thus, as illustrated in FIG. 4, the "fast" mode may be used for a longer distance once the first target line has been detected because the position of the first target line "calibrates" the position of the translation stage with respect to the panel.

Figure 5:
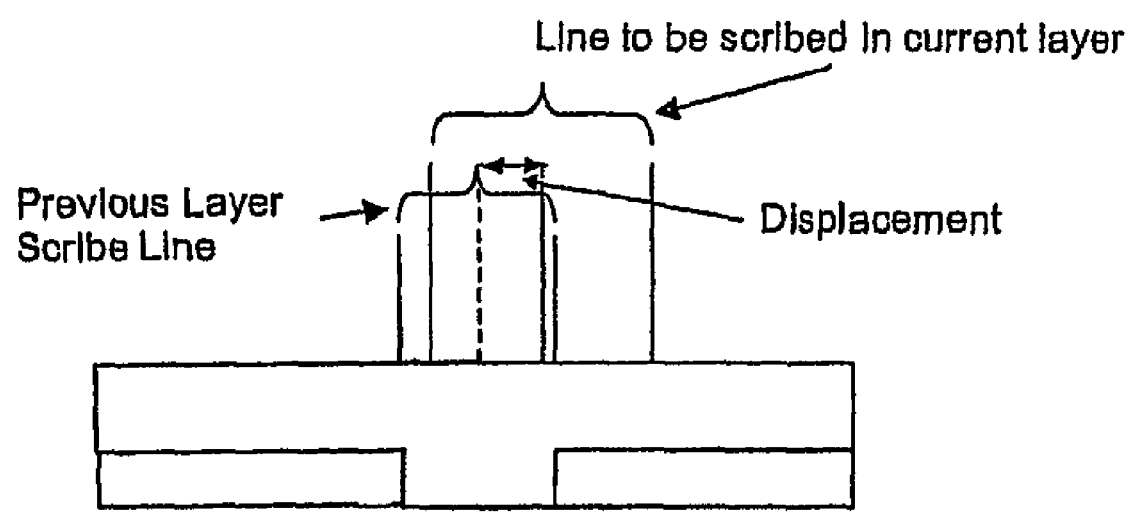
FIG. 5 is a diagram illustrating an offset scribe pattern.

In order to scribe accurate lines, it is important that the laser patterning system determines the left and right edges of the scribe lines in the previous layer accurately and positions the laser (beam or array) according to the specifications for the current layer. For example, the most straightforward case is the direct overlay between the current and the previous layer. In this case, the laser system may be positioned substantially in the center between the two edges of the lines detected by the pattern recognition system. If, on the other hand, the pattern for the current layer is displaced laterally from the previous layer, the position of the laser system may need to be adjusted accordingly so that it is centered on the position of the line for the current layer. This scenario is illustrated in the diagram shown in FIG. 5.

Figure 6:
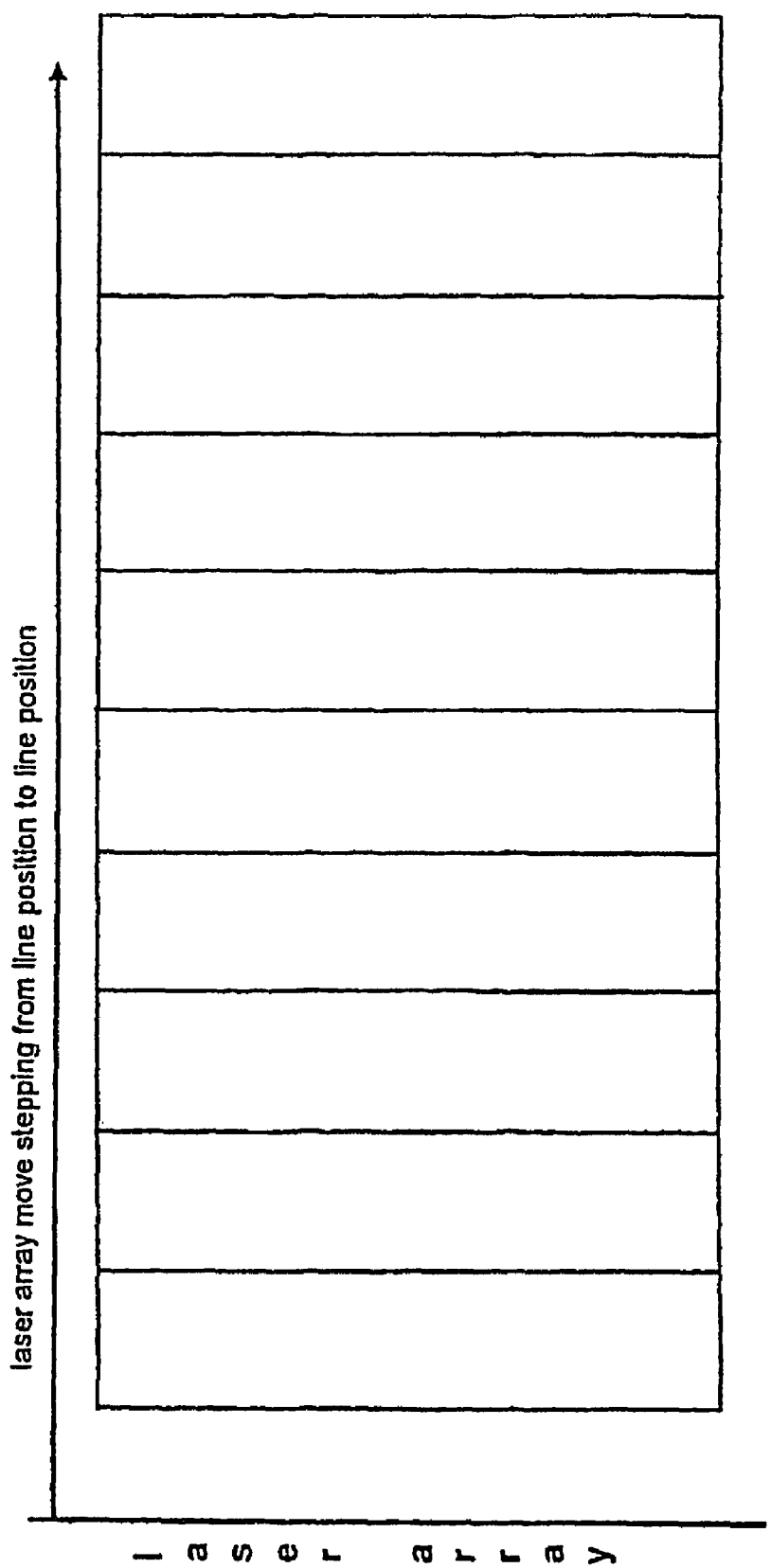
FIG. 6 is a diagram of a base layer scribed in the X-direction.
Figure 7:
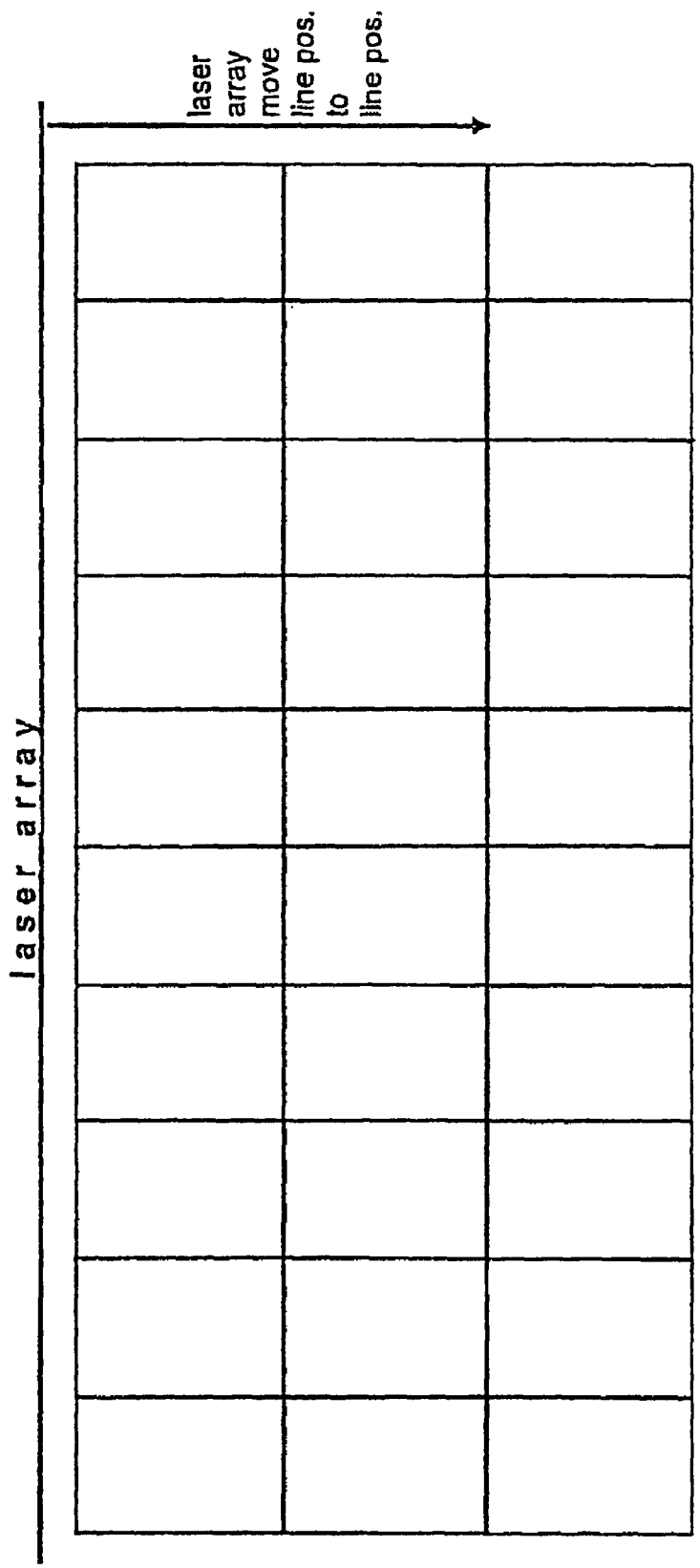
FIG. 7 is a diagram of the base layer of FIG. 6 scribed in the Y-direction.

As previously discussed, the first patterning step generally includes scribing the blank Mo layer in a first direction. In one exemplary embodiment as illustrated in FIG. 6, the blank Mo layer may first be scribed in the X-direction. As illustrated in FIG. 6, the laser may be stepped from target line position to target line position in order to scribe the desired lines with the laser. Once the Mo layer has been scribed in the first direction, the first patterning step may also include scribing the Mo layer in a second direction. In one exemplary embodiment as illustrated in FIG. 7, the second direction may be the Y-direction, thus creating a rectangular grid of panel sections in the Mo layer. As will be appreciated by those skilled in the art, embodiments of panel layers are contemplated that have scribe lines in only a single direction without departing from the intended scope of the present invention.

After scribing the lines in the Mo layer, the next layer (i.e., the CIGS layer in the present example) may be deposited on top of the Mo layer. Then, the pattern lines in the Mo layer may be detected using any suitable detection means including, for example, backlight illumination (contrast method) or refraction at the different material layers. A brief description of each exemplary method is provided below.

With regard to the contrast method for detecting pattern lines, because the Mo layer is opaque to visible and near IR light, the scribe lines in the Mo layer may be detected after the following layer has been deposited through any suitable contrast means. In one exemplary embodiment, this method may be performed by illuminating the panel from the back side and detecting contrast changes as a detector scans across the front surface of the panel. Using fast and slow motion modes (as described above) and detecting contrast changes, the laser patterning system may locate the edges of the scribe pattern at a lateral resolution of, for example, 0.1 mm.

Figure 8:
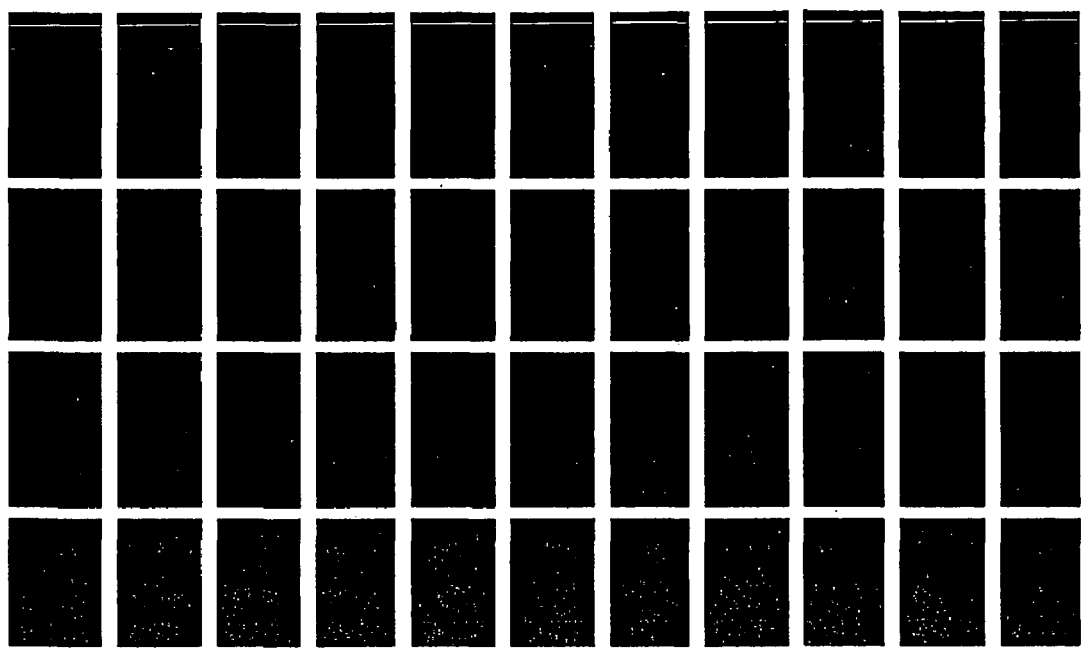
FIG. 8 is a diagram illustrating line recognition using a contrast method in accordance with the present invention.

FIG. 8 is a diagram illustrating line recognition using a contrast method in accordance with the present invention. As illustrated in FIG. 8, contrast image detection may be used to determine the left, right, upper and lower line edges. As will be appreciated by those skilled in the art, once a line has been detected and the laser is positioned in the center for the line to be written, the laser may be activated to ablate the layer in the area of the scribe line.

Figure 9:
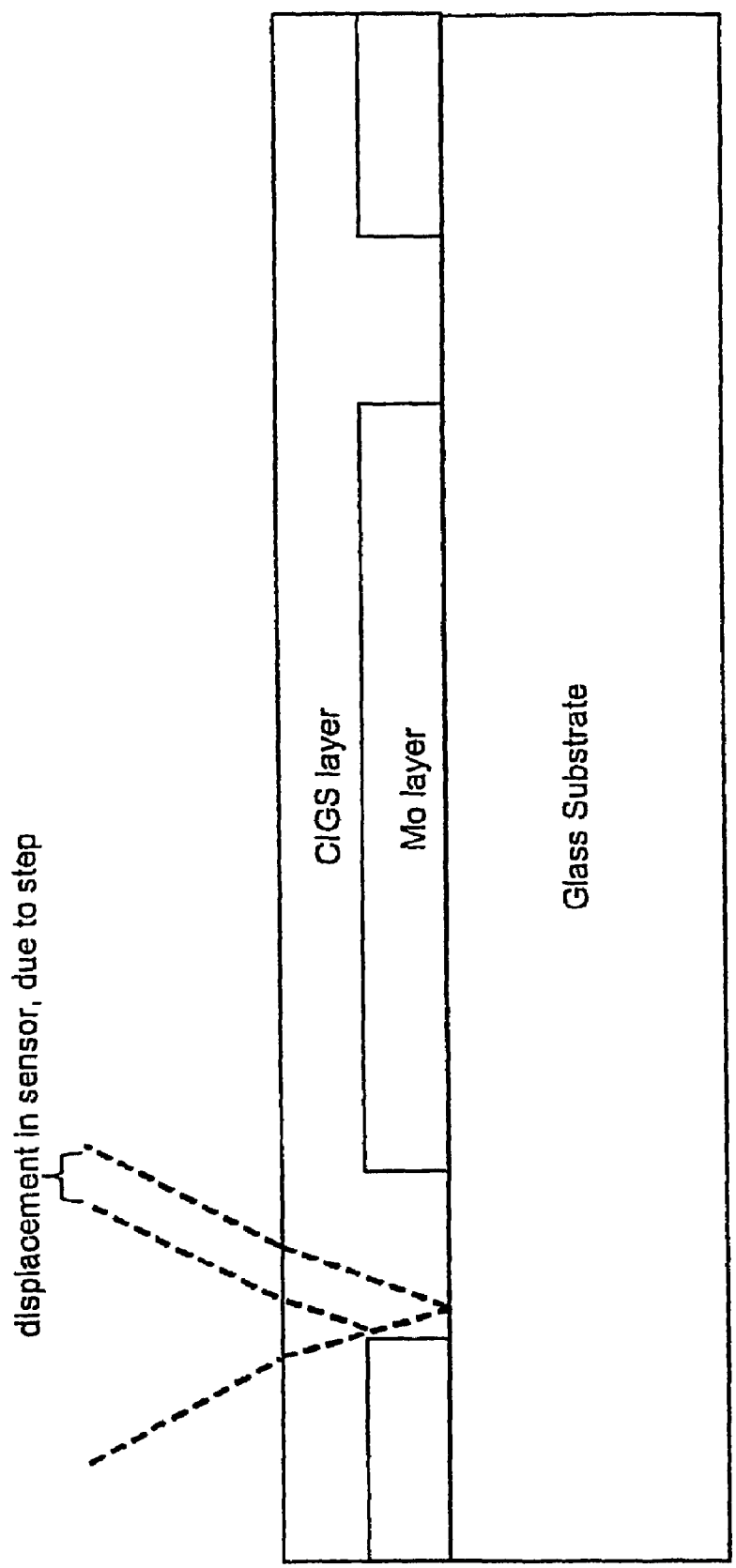
FIG. 9 is a diagram illustrating use of a refraction method to determine a line edge in a base layer.
Figure 10:
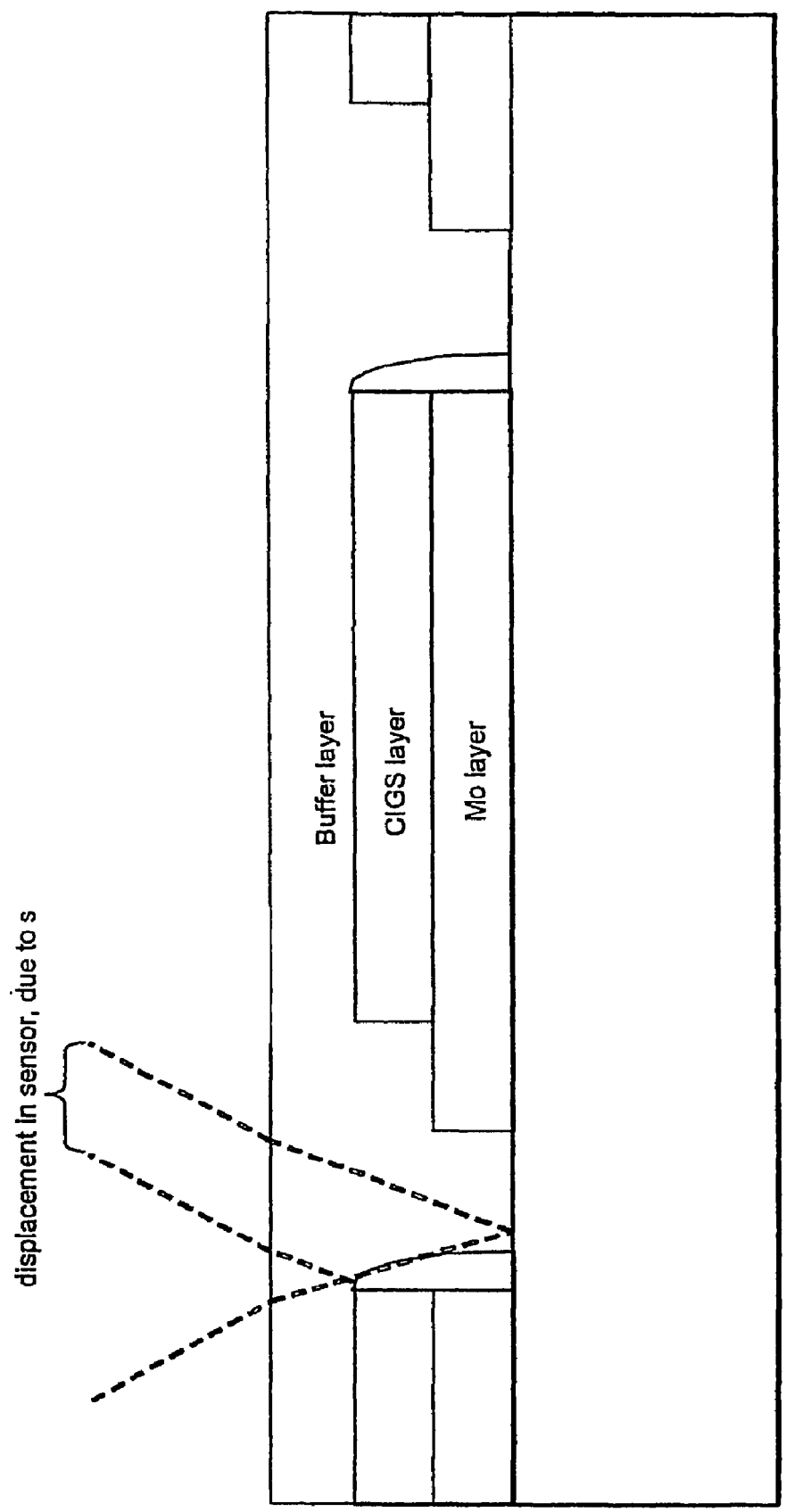
FIG. 10 is a diagram illustrating use of the refraction method to determine a line edge in a functional layer.

Next with regard to the refraction method, an IR light source may be used to detect pattern lines. In one exemplary embodiment, the IR light source may be a low power laser. FIG. 9 is a diagram illustrating use of the refraction method to determine a line edge in the Mo layer, while FIG. 10 is a diagram illustrating use of the refraction method to determine a line edge in the CIGS layer.

With regard to the diagram of FIG. 9, the beam of the laser may be focused on the surface, and the backscattered light beam may show displacement shift based on the layer thickness. Until the light beam reaches the first reflecting surface, the interference pattern will change with the thickness of the layer. The measurement method may determine the line edges and adjust the position of the laser array into the exact position of the line pattern of the Mo layer located underneath. Thereafter, the laser array may be operated to remove the CIGS material to scribe the line in accordance with the required patterning (see FIG. 9).

As will be appreciated by those skilled in the art, in the case of edge detection where there is an increasing layer thickness, the interference pattern may change from amplification to cancellation or vice versa. Furthermore, the "in situ" measured layer thickness may indicate, where there is a jump in value, that the edge was passed during the previous slow mode motion of the detector system.

Moving on, once the buffer layer is deposited onto the CIGS layer, the buffer layer may be patterned using the methodology described above. Generally speaking, the criteria are the same and the line edges may be detected via thickness or interference pattern changes. This process is illustrated in the diagram of FIG. 10.

Figure 11:
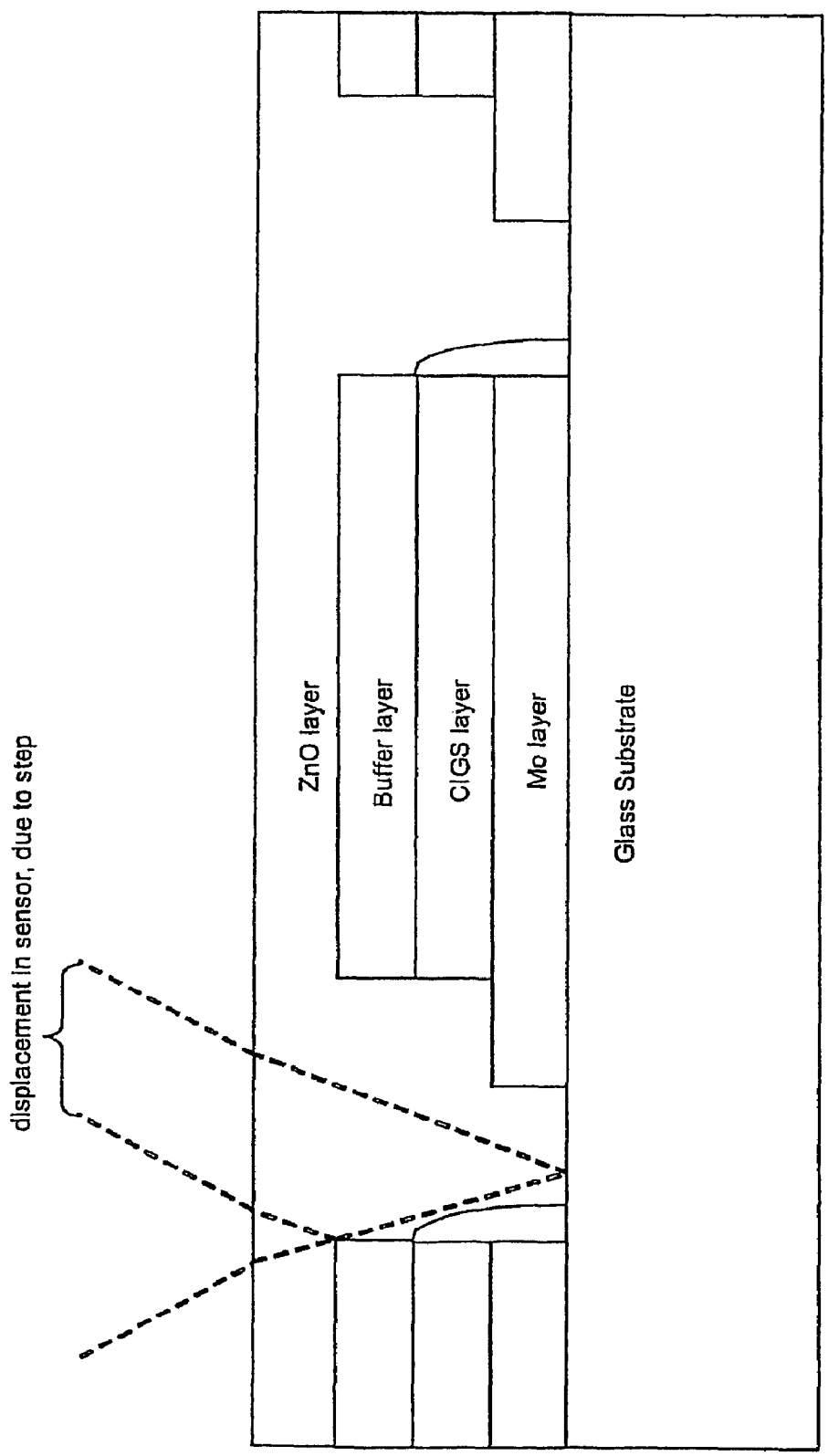
FIG. 11 is a diagram illustrating use of the refraction method to determine a line edge in a buffer layer.
Figure 12:
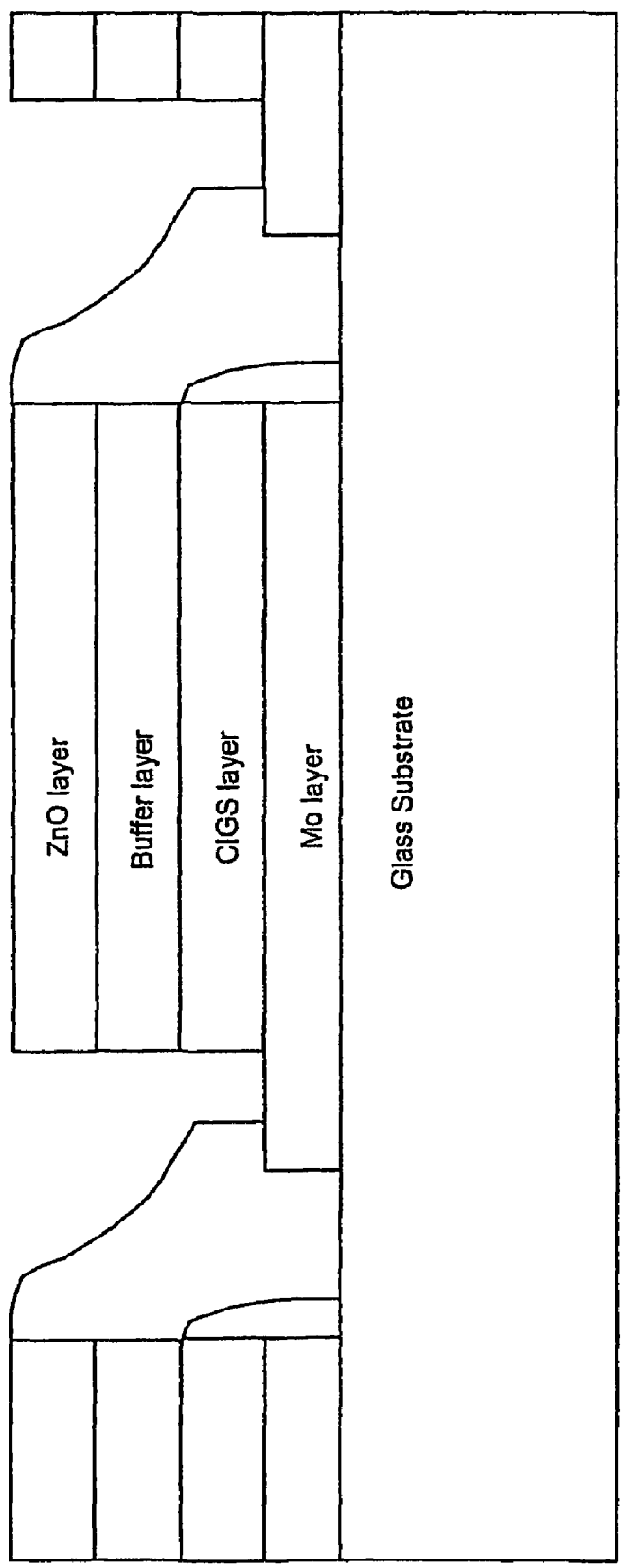
FIG. 12 is a diagram illustrating one exemplary completed panel manufactured using the refraction method of line edge determination.

Once the buffer layer has been deposited and patterned, the final layer of the panel to be patterned is the upper contact layer (which may be formed from, for example, ZnO). Once again, the change in thickness and/or interference pattern may be used to detect a line edge as illustrated in FIG. 11, and the lines may be scribed after detection. This step completes the formation of the electrical contacts on the panel, and also functions to prevent electrical shorts between individual cells as will be appreciated by those skilled in the art and as illustrated in FIG. 12.

Figure 13:
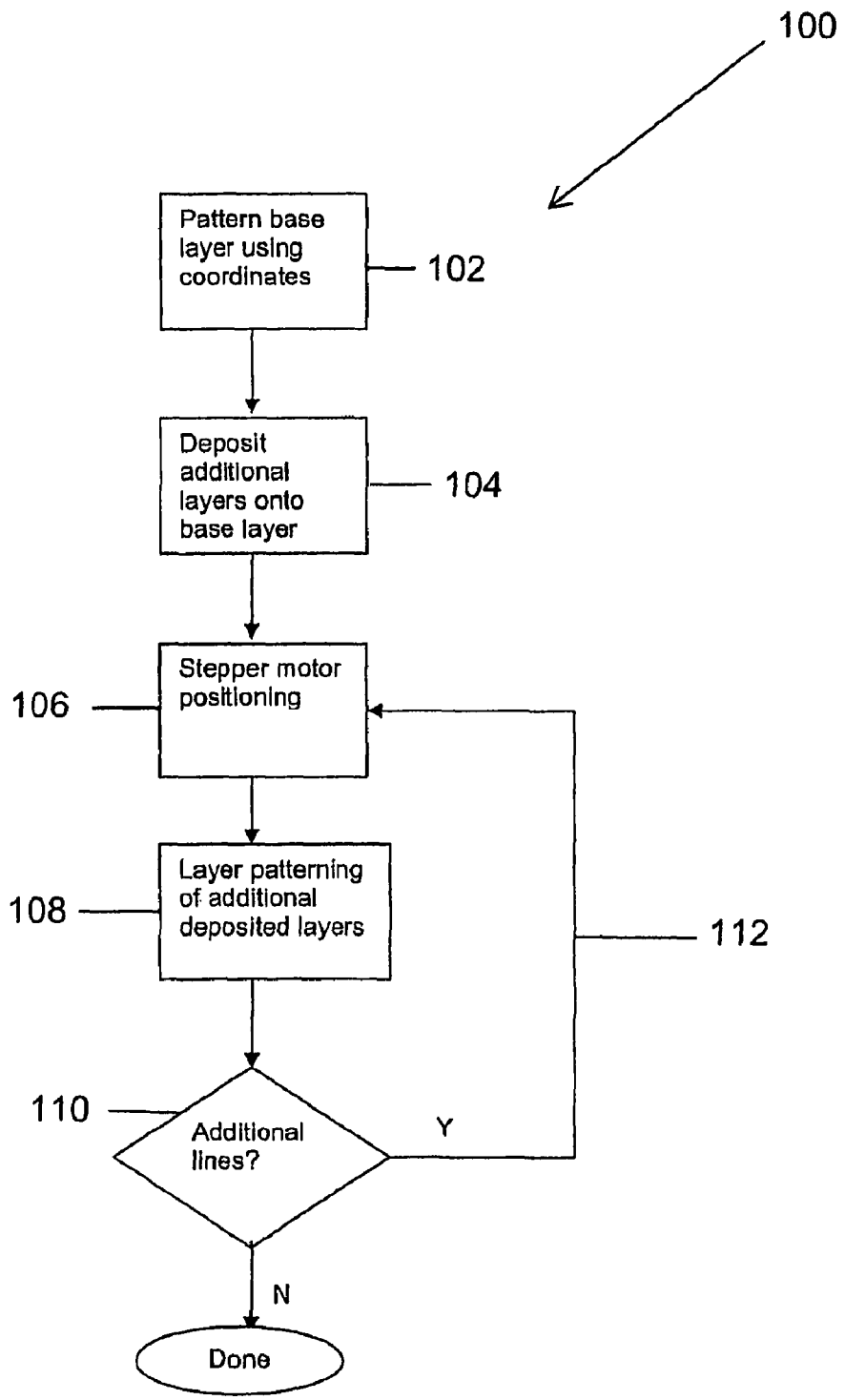
FIG. 13 is a flowchart illustrating one exemplary high level process flow of the system and method of the present invention.

FIG. 13 is a flowchart illustrating one exemplary high level process flow 100 of the system and method of the present invention. The process flow begins at step 102 where a desired line pattern is formed in the base layer using predefined coordinates. Once again, the base layer may be the Mo layer, and the line pattern may be formed using any conventional laser technique. Next, functional layers may be deposited on top of the base layer at step 104. In one exemplary embodiment, these layers may include the CIGS and buffer layers. Next, the computerized control system may operate the stepper motor at step 106 to detect a first line formed in the base layer. Once the line is detected, the laser may be operated at step 108 to scribe a line in the functional layers in accordance with the desired line pattern. The functional layers may be scribed using any suitable laser, including a laser diode array which may make the separation in a single shot. The process continues at step 110 where the control system determines whether additional lines must be detected and scribed in the layer. If no additional lines must be scribed in the layer, then the process is complete. However, if additional lines must be scribed in the layer, then the process enters a control loop 112 and returns to step 106 where the next line in the pattern is detected.

Figure 14:
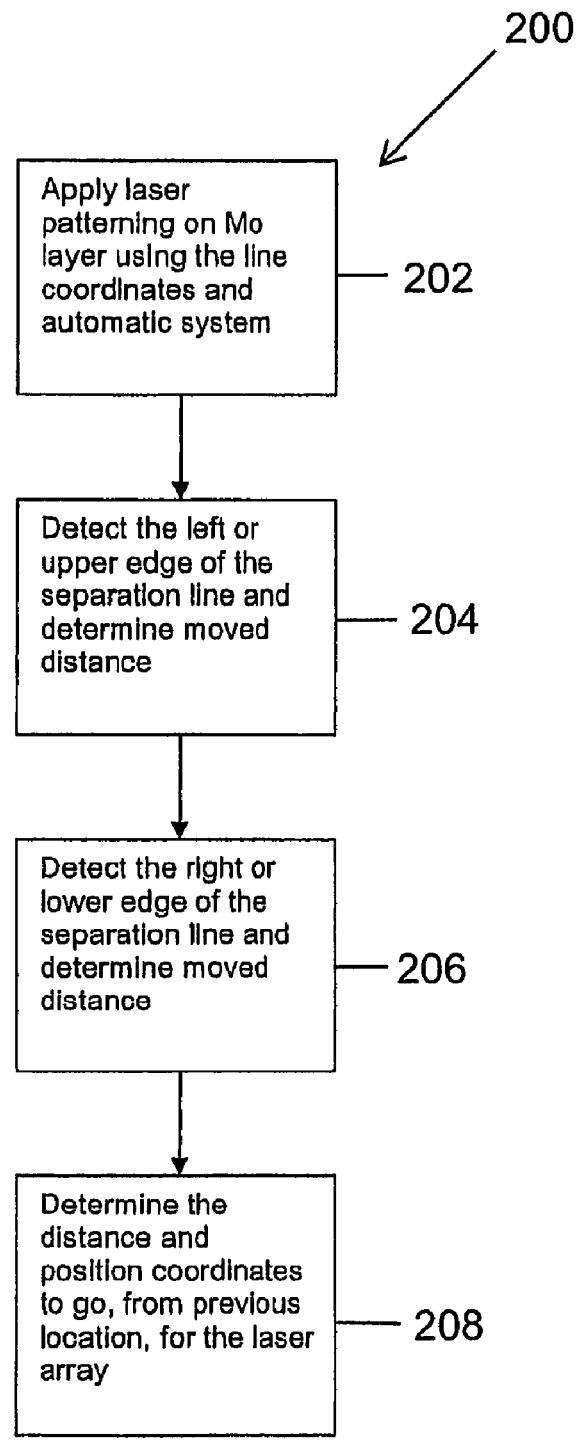
FIG. 14 is flowchart illustrating one exemplary measurement process that may be used in accordance with the present invention.

FIG. 14 is flowchart illustrating one exemplary measurement process 200 that may be used in accordance with the present invention. Beginning with step 202, laser patterning may be applied on the Mo layer using a predefined line coordinate system. Next, at step 204, the left (or upper) edge of the separation line may be detected, and the distance moved by the translation stage may be determined. With regard to step 204, the following definitions may be applied:

Left edge coordinate: $lec_n$
Right edge coordinate: $rec_{n-1}$ (previous line)

Distance: $x_{left} = lec_n - rec_{n-1}$

The process continues at step 206 where the right (or lower) edge of the separation line may be detected, and the distance moved by translation stage may be determined. With regard to step 206, the following definitions may be applied:

Right edge coordinate: $rec_n$
Left edge coordinate: $lec_n$

Distance: $x_{right} = rec_n - lec_n$

Finally, at step 208, the distance to go (from the previous location) for the laser array is determined, along with the position coordinates. With regard to step 208, the following definitions may be applied:

Distance to go:

Initial step: $\Delta x = x_{left} + (x_{right}/2)$

After $1^{st}$ step: $\Delta x = x_{left} + (x_{right}/2) + x_{off}$

Position coordinate (lpos): $lpos = lec_n + (rec_n - lec_n)/2 + x_{off}$

As will be appreciated by those skilled in the art, the stepper motors may be used by the computerized control system to move the translation stage to the desired position coordinates. In the line detection mode, the detected line edge positions may be converted to positional coordinates for the subsequent steps.

Figure 15:
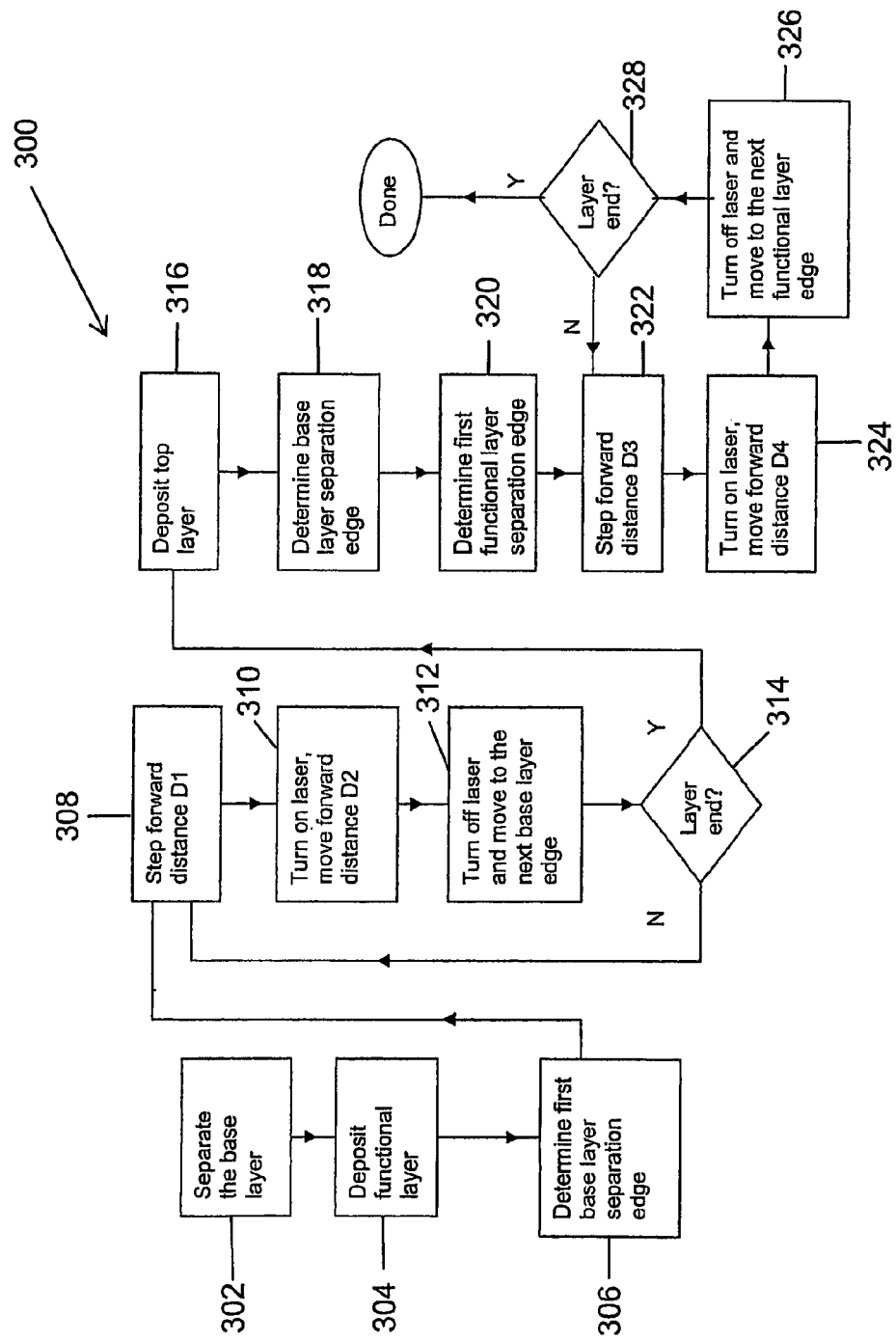
FIG. 15 is a flowchart illustrating one exemplary separation process in accordance with the present invention.

FIG. 15 is a flowchart illustrating one exemplary separation process 300 in accordance with the present invention. The separation method 300 begins at step 302 where a base layer previously deposited on top of a substrate is separated in accordance with a predefined separation line pattern. The separation line pattern may be dialed in through recipe management, with an equidistant or non equidistant separation. As will be appreciated by those skilled in the art, any separation distance is possible and within the intended scope of the present invention. The separation pattern may be defined so that the individual cells formed using the system and method of the present invention may be serialized or parallelized. The particular recipe input defines cell width and how cells are connected (i.e., serial or parallel).

The separation process continues at step 304 where one or more functional layers (as well as an optional buffer layer) are deposited on the base layer. For purposes of discussion, it will be assumed herein that only a single functional layer has been deposited. Next, at step 306, the first separation edge in the base layer is determined using any suitable detection means. The translation stage is stepped forward by a distance D1 at step 308, and then the laser is turned on and stepped forward a distance D2 at step 310 in order to scribe the desired line. Thereafter, the laser may be turned off at step 312 and the translation stage moved until the next edge of the base layer is detected. At step 314 there is a "check" to determine if the detected edge represents the end of the base layer. If the detected edge does not represent the end of the base layer, then the process loops back to step 308 where the translation stage is stepped forward by a distance D1. On the other hand, if the detected edge does represent the end of the base layer, then the process continues at step 316 where a top layer is deposited onto the functional layer.

Once the top layer is deposited at step 316, the process continues at steps 318 and 320 where the first step edge of the base layer and the first edge of the functional layer are determined. Once these edges have been determined, the translation stage is stepped forward by a distance D3 at step 322. Then, at step 324, the laser is turned on and stepped forward a distance D4 in order to scribe the desired line. Thereafter, the laser may be turned off at step 326 and the translation stage moved until the next functional layer edge is detected. At step 328 there is a "check" to determine if the detected edge represents the end of the functional layer. If the detected edge does not represent the end of the functional layer, then the process loops back to step 322 where the translation stage is stepped forward by a distance D3. On the other hand, if the detected edge does represent the end of the base layer, then the process is complete and no further separation line scribing is required.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to as a "circuit," "module" or "system." Furthermore, the present invention may take the form of a computer program product embodied in any tangible medium of expression having computer usable program code embodied in the medium.

The present invention has previously been described with reference to flowchart illustrations and block diagrams of methods, systems and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Although the present invention has been described with reference to preferred embodiments, workers skilled in the art will recognize that changes may be made in form and detail without departing from the spirit and scope of the invention.

What is claimed is:

1. A method for manufacturing thin film panels with a laser patterning system comprising:
    (a) providing a laser patterning system having a motorized translation stage, a computerized control system, an optical system, and a stepper motor operably coupled to the computerized control system and structured to cause movement of the translation stage, the translation stage holding the optical system, the optical system comprising a single beam laser, a laser array, and a refraction system;
    (b) depositing a base layer on top of a glass substrate;
    (c) separating the base layer by scribing a plurality of separation lines with the single beam laser, the plurality of separation lines corresponding with a predefined scribe pattern;
    (d) depositing a functional layer on top of the base layer;
    (e) detecting left and right base layer separation edges of a first separation line of the base layer using an infrared light source of the refraction system, the infrared light source having a beam that is focused on a top surface of the functional layer, the first separation line comprising one of the plurality of separation lines, the translation stage scanning across the top surface to detect the left and right base layer separation edges, the translation stage moving from a park position in a fast mode at a first rate of speed and at a predetermined distance entering a slow mode having a second rate of speed to detect the left and right base layer separation edges;
    (f) operating the stepper motor to move the translation stage forward by a first distance;
    (g) activating the laser array and operating the stepper motor to move the translation stage forward by a second distance based on a position relative to a determined center between the left and right base layer separation edges;
    (h) deactivating the laser array;
    (i) detecting left and right base layer separation edges of a subsequent separation line using the refraction system, the subsequent separation line comprising one of the plurality of separation lines, the translation stage moving in the fast mode at the first rate of speed and at the predetermined distance entering the slow mode having the second rate of speed to detect the left and right base layer separation edges of the subsequent separation line;
    (j) repeating steps (f)-(i) to form a plurality of functional separation lines until the translation stage detects an end of the base layer;
    (k) when the translation stage detects the end of the base layer, depositing a top layer on top of the functional layer;
    (l) detecting left and right functional layer separation edges of a first functional layer separation line of the plurality of functional layer separation lines using the refraction system, wherein the beam of the infrared light source is focused on a top surface of the top layer;
    (m) operating the stepper motor to move the translation stage forward by a third distance upon detection of the first functional layer separation edge;
    (n) activating the laser array and operating the stepper motor to move the translation stage forward by a fourth distance based on a position relative to a determined center between the left and right functional separation edges;
    (o) deactivating the laser array;
    (p) detecting left and right functional layer separation edges of a subsequent functional layer separation line using the refraction system, the subsequent functional layer separation line comprising one of the plurality of functional layer separation lines, the translation stage moving in the fast mode at the first rate of speed and at the predetermined distance entering the slow mode having the second rate of speed to detect the left and right functional layer separation edges of the subsequent functional layer separation line; and
    (q) repeating steps (m)-(p) until the translation stage detects an end of the functional layer.

2. The method of claim 1, wherein the predetermined distance from the first separation line is greater than the subsequent predetermined distance from the subsequent separation line.

3. The method of claim 2, wherein the predetermined distance from the first separation line comprises a distance of about 10 millimeters and the subsequent predetermined distance from the subsequent separation line comprises a distance of about 2 millimeters.

4. The method of claim 1, wherein the first rate of speed is about 20 times greater than the second rate of speed.

5. The method of claim 4, wherein the first rate of speed comprises a speed of about 20 millimeters per second and the second rate of speed comprises a speed of about 1 millimeter per second.

6. The method of claim 1, wherein the single beam layer comprises an individual Nd YAG laser beam for scribing the base layer, the base layer comprising a Molybdenum layer.

7. The method of claim 6, wherein the laser array comprises a linear array of diode lasers for scribing the functional layer, the functional layer comprising one or more Copper, Indium, Gallium, Selenide ("CIGS") photovoltaic layers.

* * * * *